(12) United States Patent
Maruyama et al.

(10) Patent No.: US 10,475,691 B2
(45) Date of Patent: Nov. 12, 2019

(54) SUBSTRATE TRANSFER HAND

(71) Applicant: Ebara Corporation, Tokyo (JP)

(72) Inventors: Toru Maruyama, Tokyo (JP);
Yasuyuki Motoshima, Tokyo (JP);
Yohei Eto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 736 days.

(21) Appl. No.: 15/063,137

(22) Filed: Mar. 7, 2016

(65) Prior Publication Data

US 2016/0264365 A1 Sep. 15, 2016

(30) Foreign Application Priority Data

Mar. 10, 2015 (JP) ................... 2015-046668

(51) Int. Cl.
*H01L 21/687* (2006.01)
*B25J 15/00* (2006.01)
*B25J 11/00* (2006.01)

(52) U.S. Cl.
CPC ..... *H01L 21/68707* (2013.01); *B25J 11/0095* (2013.01); *B25J 15/0014* (2013.01); *B25J 15/0038* (2013.01)

(58) Field of Classification Search
CPC combination set(s) only.
See application file for complete search history.

(56) References Cited

U.S. PATENT DOCUMENTS 5,061,144 A 10/1991 Akimoto et al.
7,735,710 B2 * 6/2010 Kurita ................ H01L 21/68
228/49.4

(Continued)

FOREIGN PATENT DOCUMENTS

CN 100426483 C 10/2008
CN 100440421 C 12/2008
(Continued)

OTHER PUBLICATIONS

Japanese Office Action issued in Patent Application No. JP 2015-046668 dated Aug. 21, 2018.
(Continued)

*Primary Examiner* — Michael S Lowe
(74) *Attorney, Agent, or Firm* — Pearne & Gordon LLP

(57) ABSTRACT

A substrate transfer hand is configured to sandwich a substrate between a plurality of receiving members and a gripping member and to fix the substrate by moving the gripping member with an actuator. The plurality of receiving members each have a flat plate-shaped support portion mounted on the main hand body, a substrate outer periphery holding portion supported on the support portion and configured to hold an outer periphery of the substrate, and a substrate lower surface holding portion supported on the support portion and configured to hold a lower surface of the substrate. The substrate outer periphery holding portion has a portion provided vertically from the support portion and configured to hold the substrate in contact with the outer periphery of the substrate. The substrate lower surface holding portion has a portion inclined from an outer peripheral side toward an inner side of the substrate to be held. The substrate outer periphery holding portion and the substrate lower surface holding portion are spaced from each other by a gap or a groove.

14 Claims, 14 Drawing Sheets

(56) References Cited

U.S. PATENT DOCUMENTS

| | | | |
|---|---|---|---|
| 2006/0131903 A1 | 6/2006 | Bonora et al. | |
| 2010/0096869 A1 | 4/2010 | Mantz | |
| 2015/0279719 A1 | 10/2015 | Nishida | |

FOREIGN PATENT DOCUMENTS

| | | | |
|---|---|---|---|
| CN | 101872732 A | 10/2010 | |
| JP | 2002-134586 A | 5/2002 | |
| JP | 2002-141405 A | 5/2002 | |
| JP | 2003-077980 A | 3/2003 | |
| JP | 2007-067303 A | 3/2007 | |
| JP | 2007-525001 A | 8/2007 | |
| JP | 4600856 B2 | 10/2010 | |
| JP | 2012-212751 A | 11/2012 | |
| JP | 3182013 | 2/2013 | |
| JP | 2014-022419 A | 2/2014 | |
| JP | 2014-175404 A | 9/2014 | |

OTHER PUBLICATIONS

Office action issued in Chinese Patent Application No. 201610132811.6 dated Oct. 25, 2018.

Singapore Search Report issued in Singapore Patent Application No. 10201601804Q dated Jul. 16, 2018.

\* cited by examiner

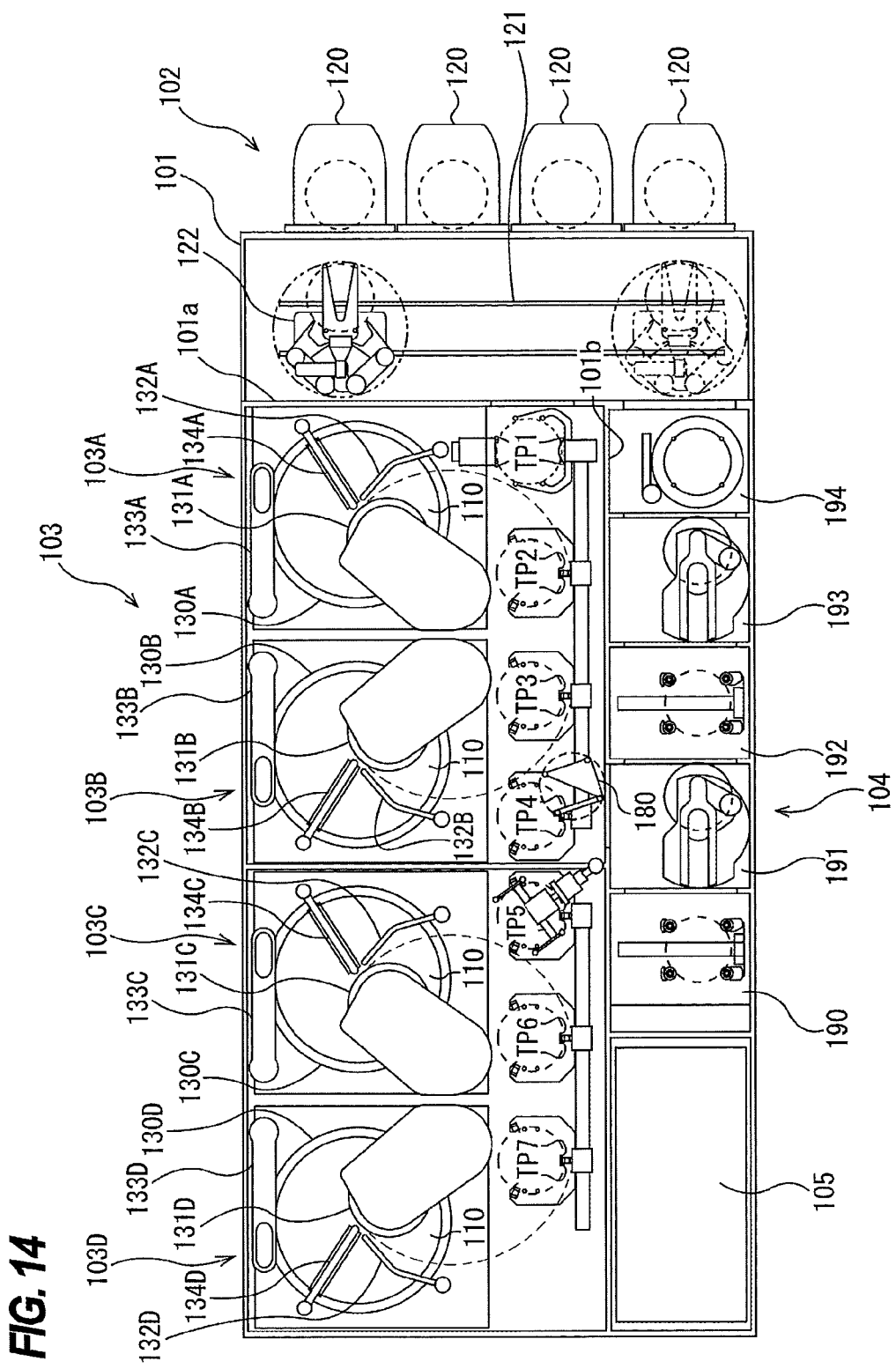

SUBSTRATE TRANSFER HAND

CROSS REFERENCE TO RELATED APPLICATION

This document claims priority to Japanese Patent Application No. 2015-046668 filed Mar. 10, 2015, the entire contents of which are hereby incorporated by reference.

BACKGROUND

When a substrate such as a semiconductor wafer or a liquid crystal glass is transferred in a fabrication process of semiconductor devices, liquid crystals, or the like, the lower surface of the substrate is attracted to and held by a hand of a robot, and the robot and the hand are moved to transfer the substrate to a next process. This system of attracting the lower surface of the substrate by the hand may cause damage to the lower surface of the substrate or may cause particles to be attached to the lower surface of the substrate at the time of attraction.

There is also a hand for holding an outer peripheral portion of a substrate by dropping the substrate into a concave recess of the hand. However, because it is necessary to provide a clearance (gap) between the outer peripheral portion of the substrate and the concave recess for receiving the substrate, the substrate may be displaced in position or may fall, and thus the substrate cannot be transferred at a high speed.

For the above reasons, an edge-grip hand (referred also as an edge-grip end effector or an edge clamp hand) for gripping an outer peripheral portion of a substrate has recently become mainstream. Japanese Patent Publication No. 4600856 discloses an edge-grip hand whose receiving parts and a gripping part for gripping an edge of a substrate are inclined to grip the substrate only through contact between a portion of the outer peripheral portion of the substrate, and the receiving parts and the gripping part.

However, the edge-grip hand actually has regions where the substrate is brought into sliding contact with the receiving parts and the gripping part, and thus particles are generated from such regions. Generally, the surface, to be processed, of the substrate faces upwardly and the hand is disposed below the substrate, and the receiving parts and the gripping part are also disposed below the outer peripheral portion of the substrate. The substrate transfer space is kept in a downflow condition in many instances. Furthermore, because an area which is a few mm (generally, about 3 mm) wide at the outer peripheral portion of the substrate is not usually used as products, even if particles are generated, they pose no particular problems. Nevertheless, a different situation arises in a wet environment.

FIGS. 16A and 16B are schematic views showing the operation of a general edge-grip hand in a wet environment.

As shown in FIG. 16A, when the hand operates in a wet environment, a liquid such as a cleaning liquid or a rinse liquid is attached to a receiving part 301 and a gripping part 302 of the hand. When the substrate which has been polished is transferred, a polishing liquid (slurry) which has been used in the polishing process is attached to the receiving part 301 and the gripping part 302 of the hand.

As shown in FIG. 16B, when the gripping part 302 is moved to chuck the substrate W between the gripping part 302 and the receiving part 301, the substrate W slides up an inclined surface of the receiving part 301. At this time, the substrate W rubs against the receiving part 301, thus generating particles. The particles are taken into the liquid such as a cleaning liquid or a rinse liquid. As shown in FIG. 16B, as the gripping part 302 and the substrate W move, the liquid flows onto the substrate under inertial forces. Therefore, the substrate W is contaminated everywhere thereof.

SUMMARY OF THE INVENTION

According to an embodiment, there is provided a substrate transfer hand which can minimize the generation of particles when a substrate is chucked and can prevent a liquid from flowing onto the substrate, thereby preventing the substrate from being contaminated.

Embodiments, which will be described below, relate to a substrate transfer hand for gripping an edge of a substrate such as a semiconductor wafer or a liquid crystal glass and transferring the substrate.

In an embodiment, there is provided a substrate transfer hand comprising: a main hand body having a flat plate shape; a plurality of receiving members provided on the main hand body and configured to hold an edge of a substrate; and a gripping member movably provided with respect to the main hand body and configured to grip the edge of the substrate, the gripping member being moved by an actuator to sandwich the substrate between the receiving members and the gripping member and to fix the substrate; wherein the plurality of receiving members each have a flat plate-shaped support portion mounted on the main hand body, a substrate outer periphery holding portion supported on the support portion and configured to hold an outer periphery of the substrate, and a substrate lower surface holding portion supported on the support portion and configured to hold a lower surface of the substrate; the substrate outer periphery holding portion has a portion provided vertically from the support portion and configured to hold the substrate in contact with the outer periphery of the substrate; the substrate lower surface holding portion has a portion inclined from an outer peripheral side toward an inner side of the substrate to be held; and the substrate outer periphery holding portion and the substrate lower surface holding portion are spaced from each other by a gap or a groove.

According to the embodiment, when holding (chucking) the substrate by the substrate transfer hand, the substrate is initially placed on the inclined portion of the substrate lower surface holding portion of the receiving member. At this time, a water droplet or water droplets (liquid) are often present on the inclined portion. Then, the substrate is moved forward by being pushed with the gripping member, and the water droplet on the inclined portion of the substrate lower surface holding portion is pushed by the substrate off the inclined portion and drops through the gap onto the support portion. Therefore, the water droplet (liquid) does not flow onto the substrate. When the substrate is further pushed by the gripping member, the outer periphery of the substrate is brought into contact with the substrate holding portion of the substrate outer periphery holding portion, and is held (chucked) by the substrate holding portion and the gripping member. At this time, since the outer periphery of the substrate is of a round shape (curved shape), the outer periphery of the substrate is supported in line contact or point contact with the substrate holding portion. Further, the lower surface of the substrate is supported in line contact or point contact with only an upper end of the inclined portion of the substrate lower surface holding portion. In this manner, when the substrate is held (chucked) by the receiving member and the gripping member, the area of the region where the substrate and the receiving member are brought in contact with each other is made as small as possible, thereby minimizing the generation of particles.

In an embodiment, the portion of the substrate outer periphery holding portion configured to hold the substrate in contact with the outer periphery of the substrate comprises an circular-arc surface along the outer periphery of the substrate.

In an embodiment, the portion of the substrate outer periphery holding portion configured to hold the substrate in contact with the outer periphery of the substrate comprises a polygonal prism having a top line which is brought into contact with the outer periphery of the substrate or a columnar body having a curved surface.

According to the embodiment, the polygonal prism comprises a triangular prism, for example, and the columnar body having a curved surface comprises a semicircular column, for example.

In an embodiment, the substrate outer periphery holding portion comprises a plurality of substrate outer periphery holding portions disposed across the gap or the groove.

In an embodiment, the inclined portion of the substrate lower surface holding portion comprises an inclined surface.

In an embodiment, the inclined portion of the substrate lower surface holding portion comprises a polygonal prism having a top line which is brought into contact with the outer periphery of the substrate or a columnar body having a curved surface.

According to the embodiment, the polygonal prism comprises a triangular prism, for example, and the columnar body having a curved surface comprises a semitruncated cone, for example.

In an embodiment, the substrate outer periphery holding portion has an upper portion which is cut off to provide a thin edge-like upper end.

In an embodiment, there is provided a substrate transfer hand comprising: a main hand body having a flat plate shape; a plurality of receiving members provided on the main hand body and configured to hold an edge of a substrate; and a gripping member movably provided with respect to the main hand body and configured to grip the edge of the substrate, the gripping member being moved by an actuator to sandwich the substrate between the receiving members and the gripping member and to fix the substrate; wherein the plurality of receiving members each have a flat plate-shaped support portion mounted on the main hand body, a substrate outer periphery holding portion supported on the support portion and configured to hold an outer periphery of the substrate, and a substrate lower surface holding portion supported on the support portion and configured to hold a lower surface of the substrate; and the gripping member has a portion configured to grip the substrate in contact with the outer periphery of the substrate, the portion configured to grip the substrate comprising a columnar body having a curved surface.

According to the embodiment, when the gripping member grips (chucks) the substrate between the gripping member and the receiving member, the curved surface of the columnar body is brought into contact with the outer periphery of the substrate to grip (chuck) the substrate. Since the outer periphery of the substrate is of a round shape (curved shape), the curved surface of the columnar body of the gripping member and the outer periphery of the substrate are brought in point contact or nearly point contact with each other. Therefore, the generation of particles at the time when the substrate and the gripping member rub against each other can be minimized. Further, the gripping member has a substrate gripping portion comprising a curved surface, and thus it is hard to allow water droplets (liquid) to stay on its curved surface.

In an embodiment, the columnar body having the curved surface comprises at least a portion of a circular cylinder or at least a portion of an inverted truncated cone.

According to the embodiment, the columnar body having a curved surface comprises a semicircular column or an inverted semitruncated cone, for example.

In an embodiment, the columnar body having the curved surface comprises an integral combination of a columnar body comprising at least a portion of a circular cylinder located at a lower side and a columnar body comprising at least a portion of an inverted truncated cone located at an upper side.

According to the embodiment, the columnar body having a curved surface comprises a semicircular column and an inverted semitruncated cone provided on the semicircular column, for example.

In an embodiment, the gripping member has an upper portion which is cut off to provide a thin edge-like upper end.

In an embodiment, there is provided a substrate transfer hand comprising: a main hand body; a receiving member provided on the main hand body and configured to hold an edge of a substrate; and a gripping member movably provided with respect to the main hand body and configured to grip the edge of the substrate, the gripping member being moved by an actuator to sandwich the substrate between the receiving member and the gripping member and to fix the substrate; wherein the receiving member has a substrate outer periphery holding surface configured to hold an outer periphery of the substrate in contact with the outer periphery of the substrate, and a substrate lower surface holding surface configured to hold a lower surface of the substrate; and the substrate outer periphery holding surface and the substrate lower surface holding surface are spaced from each other.

In an embodiment, there is provided a substrate processing apparatus comprising: a substrate transfer mechanism having the above-described substrate transfer hand; and a processing unit configured to process a substrate transferred by the substrate transfer mechanism.

The above-described embodiments offer the following advantage.

(1) When the substrate is chucked by the substrate transfer hand, even if a liquid such as water droplets is attached to the receiving member, the liquid is liable to be pushed out of the gap or groove between the substrate outer periphery holding portion and the substrate lower surface holding portion. Therefore, when the substrate is chucked, the liquid is prevented from flowing onto the substrate, thereby preventing the substrate from being contaminated.

(2) When the substrate is chucked by the substrate transfer hand, the area of the region where the receiving member and the substrate are brought into contact with each other is made as small as possible, thereby minimizing the generation of particles. Therefore, the substrate can be prevented from being contaminated.

(3) Since the gripping member of the substrate transfer hand is free of a recess for collecting a liquid such as water droplets, there is no fear of inflow of a liquid such as water droplets from the gripping member onto the substrate when the substrate is chucked.

(4) When the substrate is chucked by the substrate transfer hand, the area of a region where the gripping member and the substrate are brought into contact with each other is made as small as possible, thereby minimizing the generation of particles. Therefore, the substrate can be prevented from being contaminated.

BRIEF DESCRIPTION OF THE DRAWINGS

FIG. 1A is a schematic plan view of the substrate transfer hand and FIG. 1B is a schematic front elevational view of the substrate transfer hand;

FIG. 2A is a schematic plan view of the substrate transfer hand and FIG. 2B is a schematic front elevational view of the substrate transfer hand;

FIG. 3A is a perspective view of the receiving member, FIG. 3B is a plan view of the receiving member and FIG. 3C is a side elevational view of the receiving member;

FIG. 11A is a perspective view of the gripping member, FIG. 11B is a cross-sectional view taken along line XI-XI of FIG. 11A

FIG. 12A is a perspective view of the gripping member and FIG. 12B is a cross-sectional view taken along line XII-XII of FIG. 12A;

FIG. 13A is a perspective view of the gripping member and FIG. 13B is a cross-sectional view taken along line XIII-XIII of FIG. 13A;

FIG. 14 is a plan view showing a whole structure of a substrate processing apparatus for processing a substrate while sequentially transporting the substrates by using a substrate transfer mechanism (transfer robot) having a substrate transfer hand;

DESCRIPTION OF EMBODIMENTS

Figure 1A:
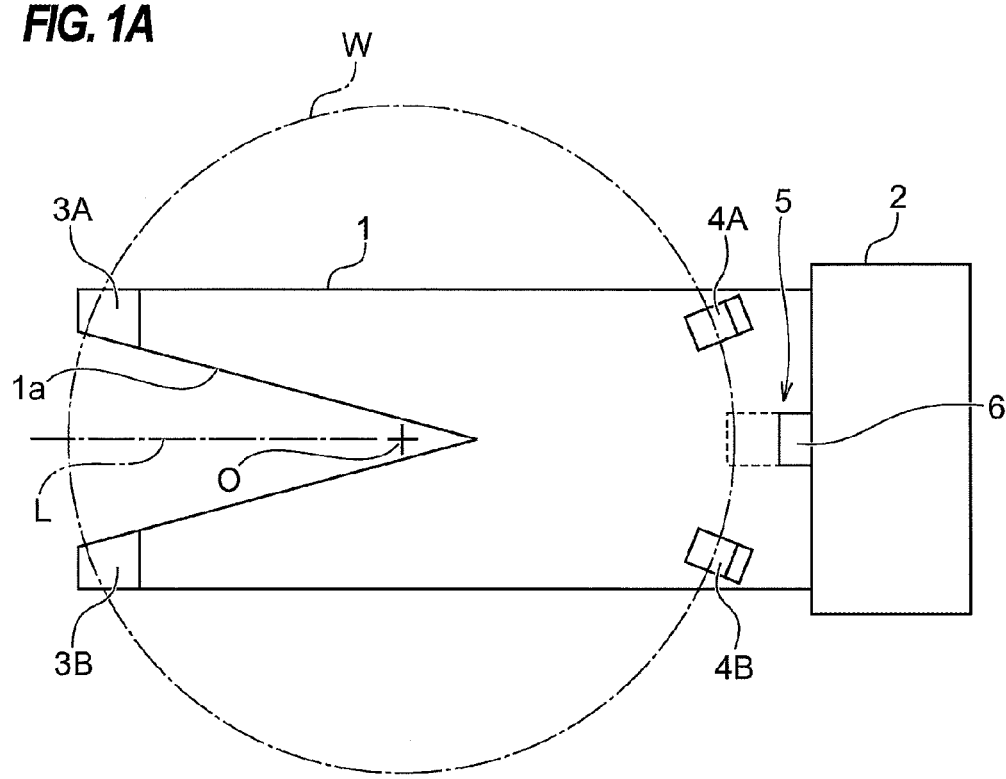
FIGS. 1A, 1B are views showing a substrate transfer hand according to a first aspect.

A substrate transfer hand according to embodiments will be described below with reference to FIGS. 1 through 15. In FIGS. 1 through 15, identical or corresponding parts are denoted by identical reference numerals, and will not be described in duplication.

Figure 1B:
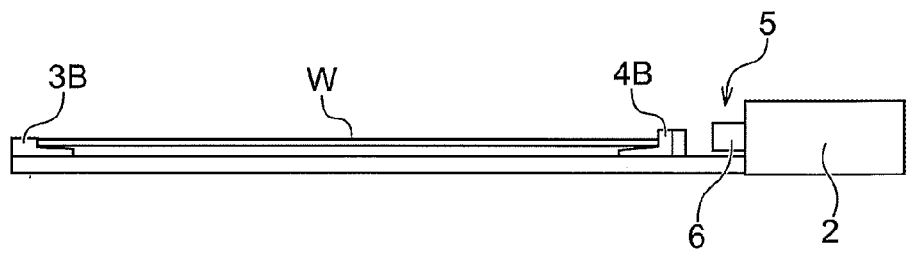

FIGS. 1A, 1B are views showing a substrate transfer hand according to a first aspect, and FIG. 1A is a schematic plan view of the substrate transfer hand and FIG. 1B is a schematic front elevational view of the substrate transfer hand.

As shown in FIGS. 1A, 1B, the substrate transfer hand includes a main hand body 1 for holding a substrate W such as a semiconductor wafer, and a mount 2 mounted on an arm (not shown) of a robot and configured to support the main hand body 1. The main hand body 1 comprises a member having a shape of a substantially rectangular flat plate, and has a V-shaped notch 1a which bifurcates its distal end portion. Receiving members 3A, 3B are provided on the bifurcated distal end portions of the main hand body 1 to hold a forward edge of the substrate W. Further, receiving members 4A, 4B are provided on a rear portion (the mount side) of the main hand body 1 to hold a rear edge of the substrate W.

A clamp mechanism 5 is provided on the mount 2 for supporting the main hand body 1. The clamp mechanism 5 is positioned centrally on a rear end portion of the main hand body 1 and disposed intermediate between the receiving members 4A, 4B. The clamp mechanism 5 includes a gripping member 6 which is brought into contact with the rear edge of the substrate W and grips the edge of the substrate W. The gripping member 6 is configured to be movable back and forth by an actuator (not shown) such as an air cylinder. Specifically, the clamp mechanism 5 has the actuator and operates the actuator to move the gripping member 6 forward toward the substrate, thereby sandwiching the substrate W between the receiving members 3A, 3B on the distal end portions and the gripping member 6 to fix (clamp) the substrate W.

Figure 2A:
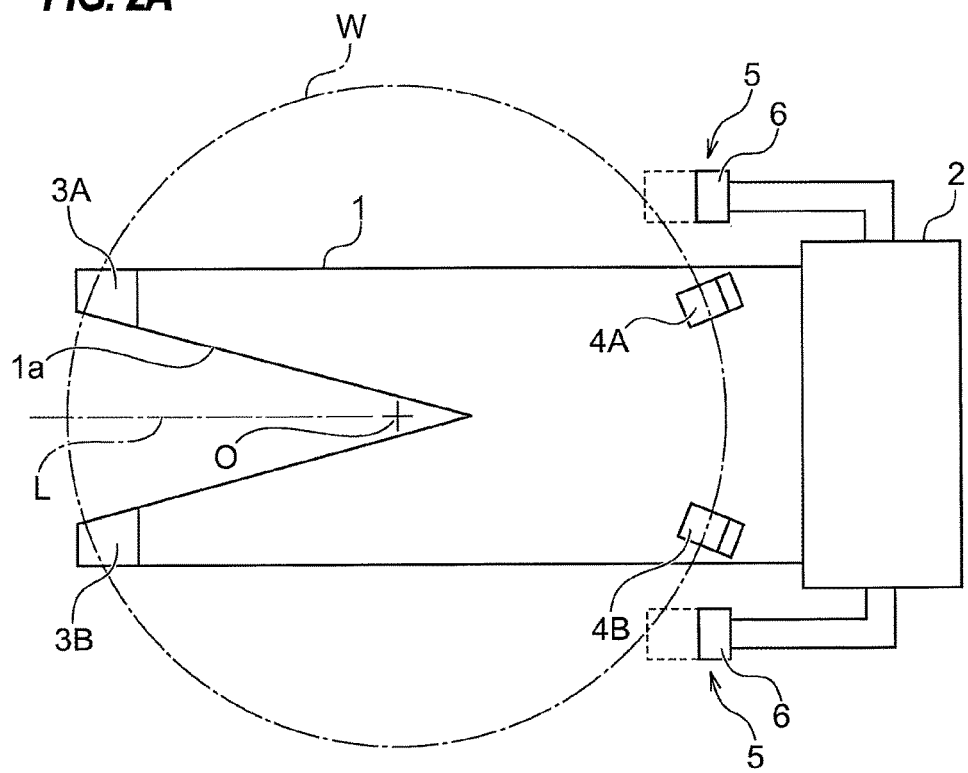
FIGS. 2A, 2B are views showing a substrate transfer hand according to a second aspect.
Figure 2B:
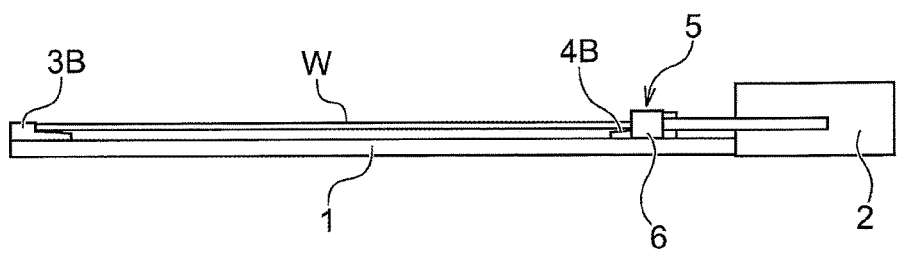

FIGS. 2A, 2B are views showing a substrate transfer hand according to a second aspect, and FIG. 2A is a schematic plan view of the substrate transfer hand and FIG. 2B is a schematic front elevational view of the substrate transfer hand.

As shown in FIGS. 2A, 2B, the substrate transfer hand according to the second aspect has two clamp mechanisms 5 which are positioned laterally of the main hand body 1 and arranged across the main hand body 1. The structures of the clamp mechanisms 5 and the gripping member 6 are identical to those shown in FIGS. 1A, 1B.

Next, the receiving members 3A, 3B for holding the forward edge of the substrate W and the receiving members 4A, 4B for holding the rear edge of the substrate W will be described in detail. The shapes of the two receiving members 3A, 3B for holding the forward edge of the substrate W are axisymmetric with respect to a central line L passing through the center O of the substrate W in FIG. 1A. Therefore, if the shape of the receiving member 3A is identified, then the shape of the other receiving member 3B is represented by a shape which is in axisymmetric relation to the identified shape with respect to the central line L passing through the center O of the substrate W in FIG. 1A. The receiving members 3A, 3B for holding the forward edge of the substrate W and the receiving members 4A, 4B for holding the rear edge of the substrate W are different from each other only in mounting directions, and thus can use an identical member. Consequently, the receiving members will hereinafter be described collectively as a receiving member 3 without suffixes A, B.

Figure 3A:
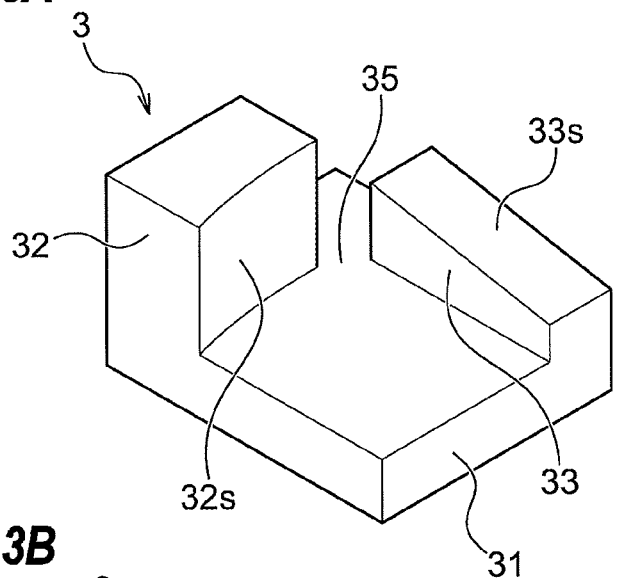
FIGS. 3A, 3B, 3C are views showing a receiving member according to a first aspect.
Figure 3B:
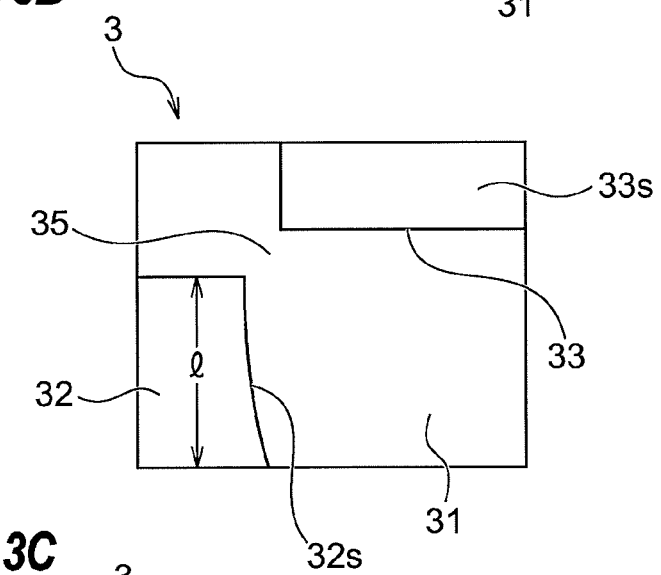
Figure 3C:
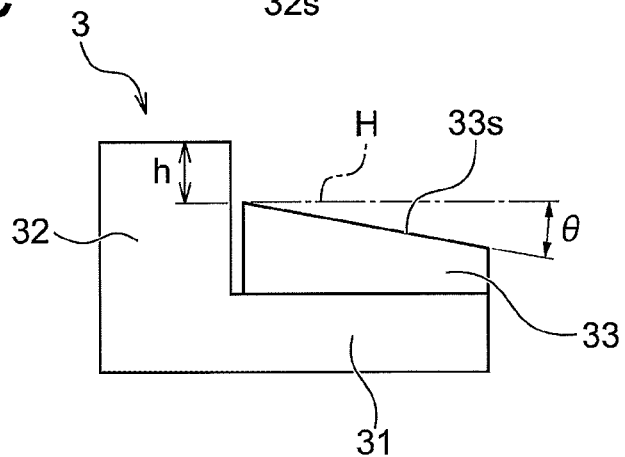

FIGS. 3A, 3B, 3C are views showing a receiving member 3 according to a first aspect. FIG. 3A is a perspective view of the receiving member 3, FIG. 3B is a plan view of the receiving member 3, and FIG. 3C is a side elevational view of the receiving member 3. As shown in FIGS. 3A, 3B and 3C, the receiving member 3 includes a flat plate-shaped support portion 31 having a planar shape of a substantially rectangle, a substrate outer periphery holding portion 32 supported on the support portion 31 for holding an outer periphery (edge) of the substrate W, and a substrate lower surface holding portion 33 supported on the support portion 31 for holding a lower surface of the substrate W.

The support portion 31 of the receiving member 3 is secured to the main hand body 1 (see FIGS. 1A, 1B) by a screw or the like in a state where the lower surface of the support portion 31 is brought in contact with an upper surface of the main hand body 1. The substrate outer periphery holding portion 32 has an inner surface formed as a circular-arc surface 32s having the same curvature as the outer periphery of the substrate W. The circular-arc surface 32s is brought in contact with the outer periphery of the substrate W to hold the substrate W. The circular-arc surface 32s extends in a vertical direction from an upper surface of the support portion 31. The substrate lower surface holding portion 33 has an upper surface formed as an inclined surface 33s that is brought in contact with the lower surface of the substrate W to hold the lower surface of the substrate W.

The substrate W has a notch formed in the outer periphery thereof. The notch has a length of about 2 mm along a circumferential direction, and thus the horizontal length of the substrate outer periphery holding portion 32 needs to be larger than the circumferential length of the notch. Therefore, according to the present embodiment, the length 1 in FIG. 3B is set in the range of (2 mm+1 mm) to (2 mm+5 mm).

The substrate outer periphery holding portion 32 is required to hold the outer periphery of the substrate by a portion ranging from a horizontal plane H (see FIG. 3C) to the upper end of the substrate outer periphery holding portion 32, i.e., a portion corresponding to a height h in FIG. 3C. When the thickness of the substrate W is represented by t, the height h is set in the range of (t mm+0 mm) to (t mm+2 mm) The inclined surface 33s of the substrate lower surface holding portion 33 is slanted downwardly from its end near the substrate outer periphery holding portion 32 toward a forward end of the support portion 31. The angle θ of inclination with respect to the horizontal plane H is set in the range of 1° to 15°, preferably 2° to 4°. Further, as shown in FIGS. 3A, 3B, a gap (or groove) 35 is formed between the substrate outer periphery holding portion 32 and the substrate lower surface holding portion 33. Specifically, the substrate outer periphery holding portion 32 and the substrate lower surface holding portion 33 are completely spaced from each other by the gap (or groove) 35, with the upper surface of the support portion 31 being exposed between the substrate outer periphery holding portion 32 and the substrate lower surface holding portion 33.

Figure 4A:
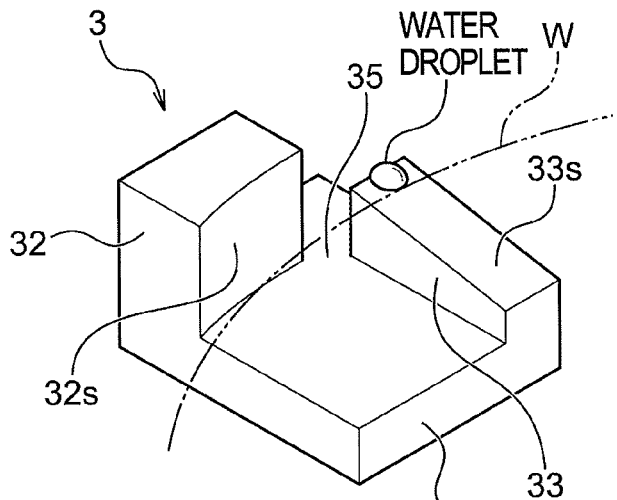
FIGS. 4A, 4B and 4C are schematic perspective views showing the manner in which the receiving member configured as shown in FIGS. 3A, 3B and 3C holds the substrate.
Figure 4B:
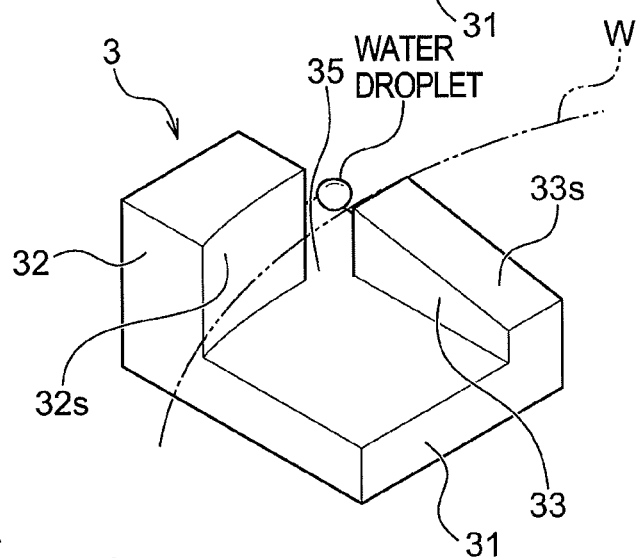
Figure 4C:
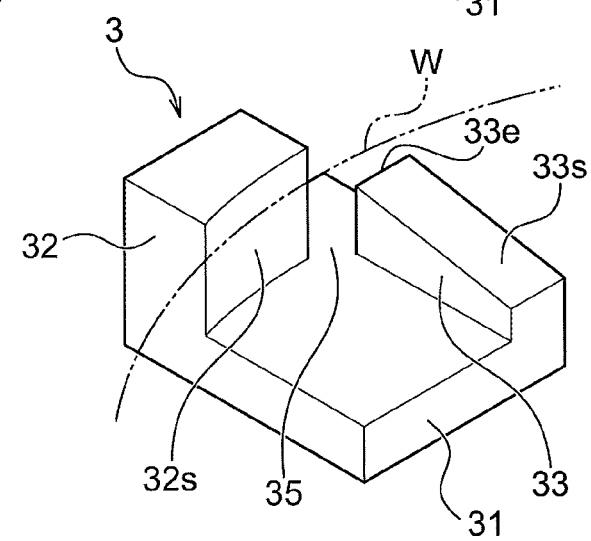

FIGS. 4A, 4B and 4C are schematic perspective views showing the manner in which the receiving member 3 configured as shown in FIGS. 3A, 3B and 3C holds the substrate W. In FIGS. 4A, 4B and 4C, the substrate W is indicated by the two-dot chain line.

When holding (chucking) the substrate W by the substrate transfer hand shown in FIGS. 1A and 1B, the substrate W is initially placed on the inclined surface 33s of the substrate lower surface holding portion 33, as shown in FIG. 4A. At this time, a water droplet or water droplets (liquid) are often present on the inclined surface 33s.

Then, as shown in FIG. 4B, the substrate W is moved forward by being pushed by the gripping member 6 (see FIGS. 1A, 1B) of the clamp mechanism 5, and the water droplet on the inclined surface 33s is pushed by the substrate W off the inclined surface 33s and drops through the gap 35 onto the support portion 31. Therefore, the water droplet (liquid) does not flow onto the substrate W.

When the substrate W is further pushed by the gripping member 6, as shown in FIG. 4C, the outer periphery of the substrate W is brought into contact with the circular-arc surface 32s of the substrate outer periphery holding portion 32, and is held (chucked) by an upper portion of the circular-arc surface 32s of the substrate outer periphery holding portion 32 and the gripping member 6 (see FIGS. 1A, 1B). At this time, since the outer periphery of the substrate W is of a round shape (curved shape), the outer periphery of the substrate W is supported in the form of line contact or nearly line contact with the circular-arc surface 32s. Further, the lower surface of the substrate W is supported in line contact with only an upper end 33e of the inclined surface 33s. In this manner, when the substrate W is held (chucked) by the receiving member 3 and the gripping member 6, the area of the region where the substrate W and the receiving member 3 are brought in contact with each other is made as small as possible, thereby minimizing the generation of particles.

Figure 5:
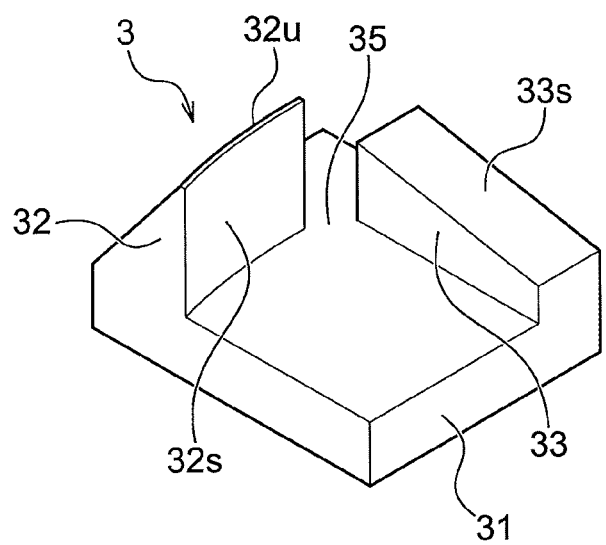
FIG. 5 is a perspective view of a modification of the receiving member according to the first aspect shown in FIG. 3A.

FIG. 5 is a perspective view of a modification of the receiving member 3 according to the first aspect shown in FIG. 3A. According to the modification, as shown in FIG. 5, an upper portion of the substrate outer periphery holding portion 32 is cut off obliquely so that the substrate outer periphery holding portion 32 has a thin upper end 32u. Therefore, the substrate outer periphery holding portion 32 is configured such that no water droplet (liquid) will stay on the upper end 32u. Other structural details of the receiving member 3 shown in FIG. 5 are identical to those of the receiving member shown in FIGS. 3A through 3C.

Figure 6:
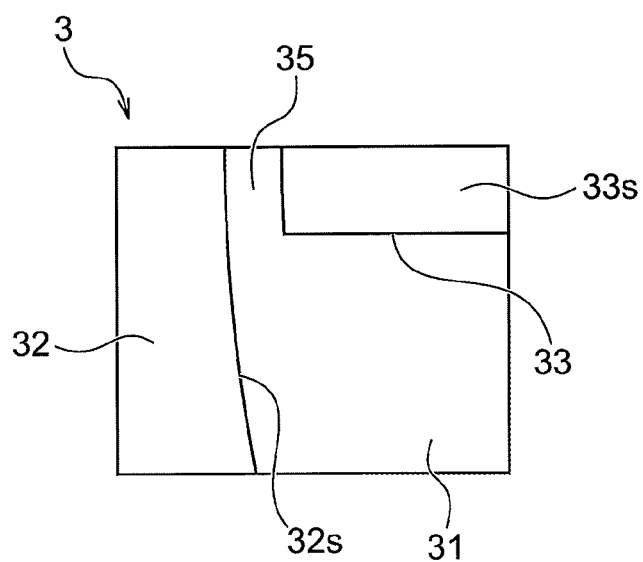
FIG. 6 is a view showing a receiving member according to a second aspect, and is a plan view of the receiving member.

FIG. 6 is a view showing a receiving member 3 according to a second aspect, and is a plan view of the receiving member 3. As shown in FIG. 6, in the receiving member 3 according to the second aspect, the substrate outer periphery holding portion 32 extends from one side to the other side of the support portion 31. Therefore, the inner surface of the substrate outer periphery holding portion 32 extends horizontally longer than the inner surface of the substrate outer periphery holding portion 32 shown in FIGS. 3A through 3C. Further, the inner surface of the substrate outer periphery holding portion 32 is formed as an circular-arc surface 32s having the same curvature as the outer periphery of the substrate W. The circular-arc surface 32s is brought in contact with the outer periphery of the substrate W to hold the outer periphery of the substrate W. A gap (or groove) 35 is formed between the circular-arc surface 32s of the substrate outer periphery holding portion 32 and an end face of the substrate lower surface holding portion 33. Other structural details of the receiving member 3 shown in FIG. 6 are identical to those of the receiving member shown in FIGS. 3A through 3C.

Figure 7:
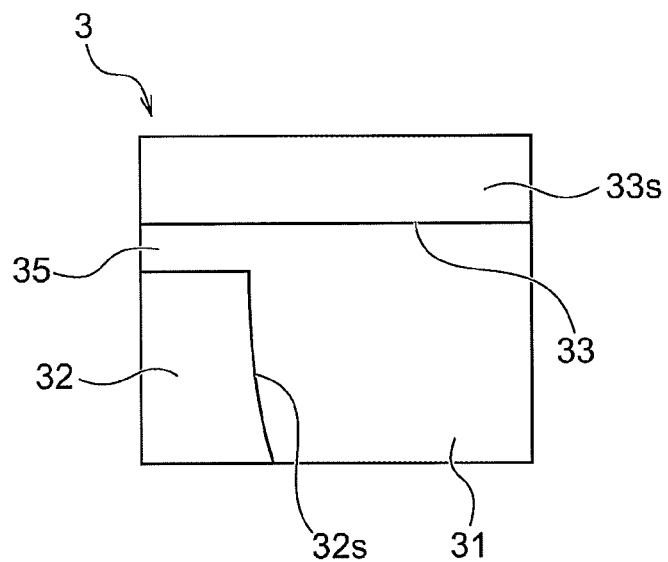
FIG. 7 is a view showing a receiving member according to a third aspect, and is a plan view of the receiving member.

FIG. 7 is a view showing a receiving member 3 according to a third aspect, and is a plan view of the receiving member 3. As shown in FIG. 7, in the receiving member 3 according to the third aspect, the substrate lower surface holding portion 33 extends from one end to the other end of the support portion 31. The inclined surface 33s of the substrate lower surface holding portion 33 has an angle of inclination in the range of 1° to 15°, preferably 2° to 4°, as is the case with the receiving member 3 shown in FIGS. 3A through 3C. A gap (or groove) 35 is formed between a side surface of the substrate outer periphery holding portion 32 and a side surface of the substrate lower surface holding portion 33. Other structural details of the receiving member 3 shown in FIG. 7 are identical to those of the receiving member shown in FIGS. 3A through 3C.

Figure 8:
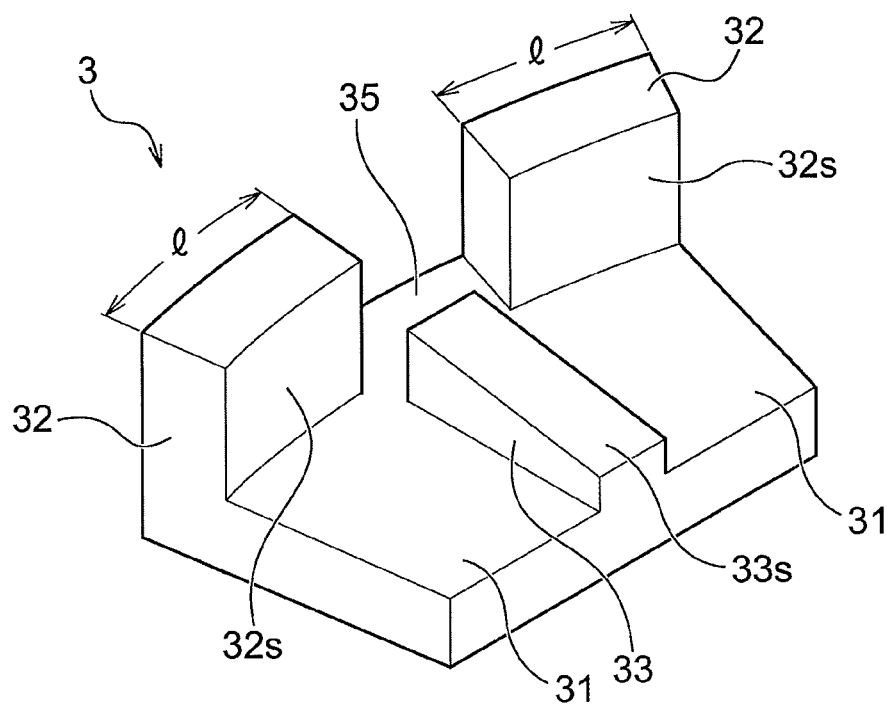
FIG. 8 is a view showing a receiving member according to a fourth aspect, and is a perspective view of the receiving member.

FIG. 8 is a view showing a receiving member 3 according to a fourth aspect, and is a perspective view of the receiving member 3. As shown in FIG. 8, the receiving member 3 according to the fourth aspect has a configuration wherein another substrate outer periphery holding portion 32 is added to the receiving member 3 shown in FIG. 3A. Specifically, a support portion 31 further extends from the outer end of the substrate lower surface holding portion 33, and another substrate outer periphery holding portion 32 is formed on the extended support portion 31. Consequently, the two substrate outer periphery holding portions 32, 32 are formed to be axisymmetric with respect to a central line passing through the center of the substrate lower surface holding portion 33. A gap (or groove) 35 is formed between the two substrate outer periphery holding portions 32, 32 and the substrate lower surface holding portion 33. According to the present embodiment, the two substrate outer periphery holding portions 32, 32 are formed, and the gap (or groove) 35 is formed between these two substrate outer periphery holding portions 32, 32. Therefore, even if the notch of the substrate W is positioned at the circular-arc surface 32s of one of the substrate outer periphery holding portions 32, the circular-arc surface 32s of the other substrate outer periphery holding portion 32 holds the outer periphery, which is free of the notch, of the substrate W. Therefore, the length 1 of the substrate outer periphery holding portions 32 can be made smaller than the circumferential length of the notch of the substrate W. Other structural details of the receiving member 3 shown in FIG. 8 are identical to those of the receiving member shown in FIGS. 3A through 3C.

Figure 9:
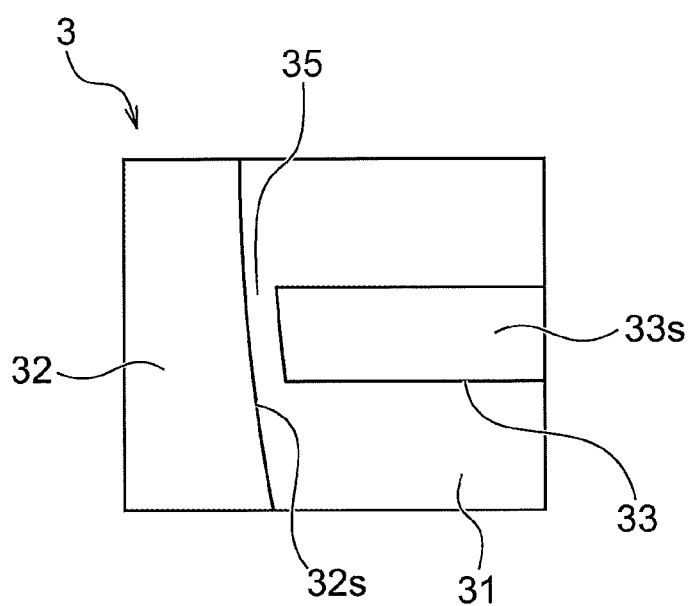
FIG. 9 is a view showing a receiving member according to a fifth aspect, and is a plan view of the receiving member.

FIG. 9 is a view showing a receiving member 3 according to a fifth aspect, and is a plan view of the receiving member 3. As shown in FIG. 9, in the receiving member 3 according to the fifth aspect, the substrate outer periphery holding portion 32 extends from one side to the other side of the support portion 31, and the substrate lower surface holding portion 33 is positioned centrally on the support portion 31. Therefore, the receiving member 3 according to the fifth aspect shown in FIG. 9 is configured such that the two substrate outer periphery holding portions 32, 32 of the receiving member 3 shown in FIG. 8 are integrated into one substrate outer periphery holding portion 32. A gap (or groove) 35 is formed between the circular-arc surface 32s of the substrate outer periphery holding portion 32 and an end face of the substrate lower surface holding portion 33. Other structural details of the receiving member 3 shown in FIG. 9 are identical to those of the receiving member shown in FIG. 8.

Figure 10A:
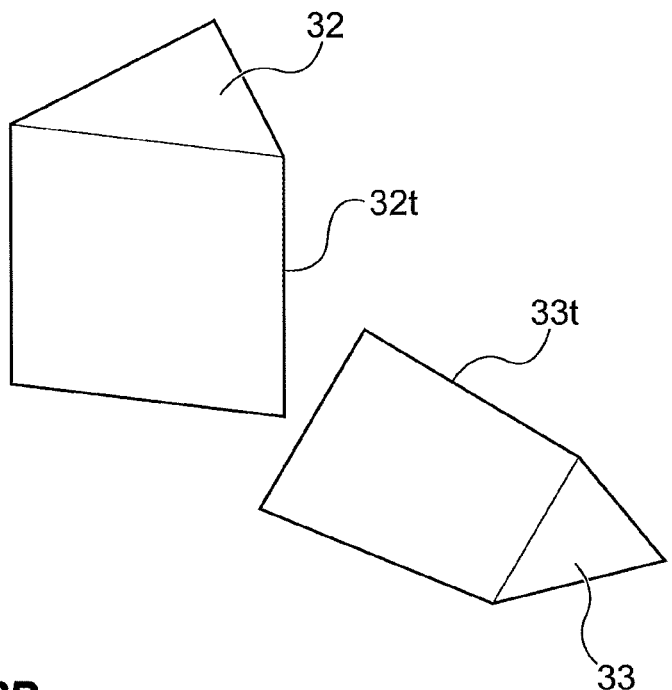
FIGS. 10A, 10B are perspective views showing modified examples of the substrate outer periphery holding portion and the substrate lower surface holding portion in the receiving member.
Figure 10B:
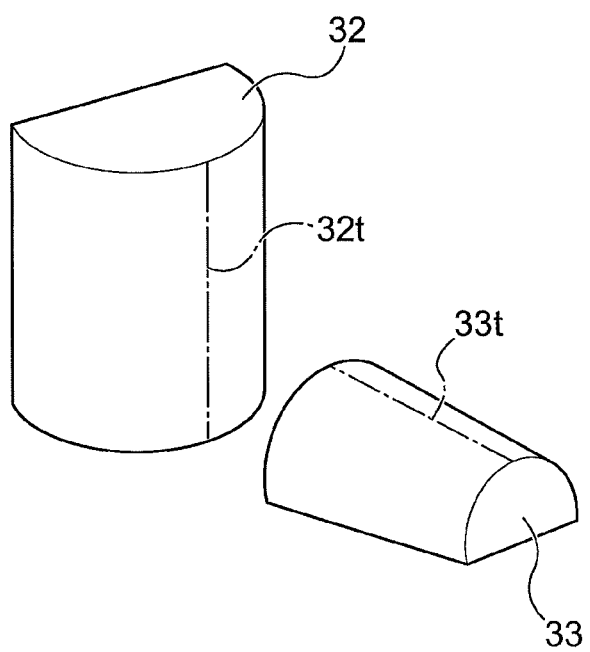

FIGS. 10A, 10B are perspective views showing modified examples of the substrate outer periphery holding portion 32 and the substrate lower surface holding portion 33 in the receiving member 3.

According to the modification shown in FIG. 10A, the substrate outer periphery holding portion 32 comprises a triangular prism, and the substrate lower surface holding portion 33 also comprises a triangular prism. The substrate outer periphery holding portion 32 comprising a triangular prism has a top line 32t extending in a vertical direction, and the substrate lower surface holding portion 33 comprising a triangular prism has a top line 33t which is inclined downwardly from one end near the substrate outer periphery holding portion 32 toward the other end of the substrate lower surface holding portion 33. The angle of inclination of the top line 33t with respect to the horizontal plane H (see FIG. 3C) is set in the range of 1° to 15°, preferably 2° to 4°. According to the modification shown in FIG. 10A, since the outer periphery of the substrate W is of a round shape (curved shape), the substrate outer periphery holding portion 32 holds the outer periphery of the substrate W in a state where the top line 32t is brought in point contact or nearly point contact with the outer periphery of the substrate W, and the substrate lower surface holding portion 33 holds the lower surface of the substrate W in a state where the top line 33t is brought in point contact or nearly point contact with the lower surface of the substrate W.

According to the modification shown in FIG. 10B, the substrate outer periphery holding portion 32 comprises a semicircular column, and the substrate lower surface holding portion 33 comprises a semitruncated cone. The substrate outer periphery holding portion 32 comprising a semicircular column has a top line 32t extending in a vertical direction, and the substrate lower surface holding portion 33 comprising a semitruncated cone has a top line 33t which is inclined downwardly from one end near the substrate outer periphery holding portion 32 toward the other end of the substrate lower surface holding portion 33. The angle of inclination of the top line 33t with respect to the horizontal plane H (see FIG. 3C) is set in the range of 1° to 15°, preferably 2° to 4°. The top line 32t of the semicircular column refers to a line interconnecting the crests of the cross-sections (semicircles) of the semicircular column, and is indicated by the dot-and-dash line in FIG. 10B. The top line 33t of the semitruncated cone refers to a line interconnecting the crests of the cross-sections (semicircles) of the semitruncated cone, and is indicated by the dot-and-dash line in FIG. 10B. According to the modification shown in FIG. 10B, since the outer periphery of the substrate W is of a round shape (curved shape), the substrate outer periphery holding portion 32 holds the outer periphery of the substrate W in a state where the top line 32t is brought in point contact or nearly point contact with the outer periphery of the substrate W, and the substrate lower surface holding portion 33 holds the lower surface of the substrate W in a state where the top line 33t is brought in point contact or nearly point contact with the lower surface of the substrate W.

According to the embodiments shown in FIGS. 10A, 10B, because the substrate outer periphery holding portion 32 and the substrate lower surface holding portion 33 can hold the substrate W in point contact with or nearly in point contact with the outer periphery of the substrate W and the lower surface of the substrate W, respectively, the generation of particles at the time when the substrate W and the substrate holding portions 32, 33 rub against each other can be minimized. Since the top line 32t of the substrate outer periphery holding portion 32 is aligned with the position of the notch of the substrate W in some cases, it is preferable that a plurality of substrate outer periphery holding portions 32 are provided as shown in FIG. 8.

Next, the gripping member 6 of the clamp mechanism 5 which is used in the substrate transfer hands shown in FIGS. 1A, 1B and FIGS. 2A, 2B will be described in detail.

Figure 11A:
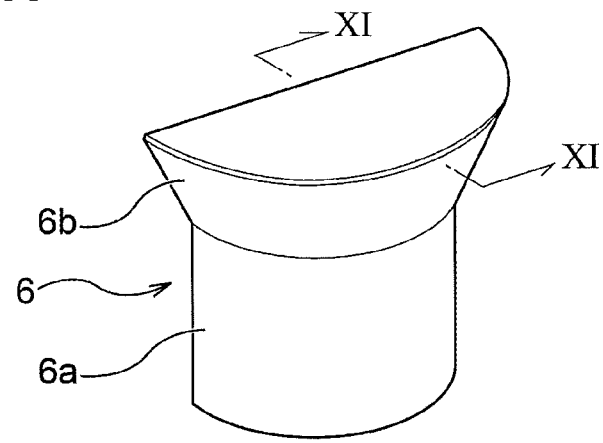
FIGS. 11A, 11B are views showing a gripping member according to a first aspect.
Figure 11B:
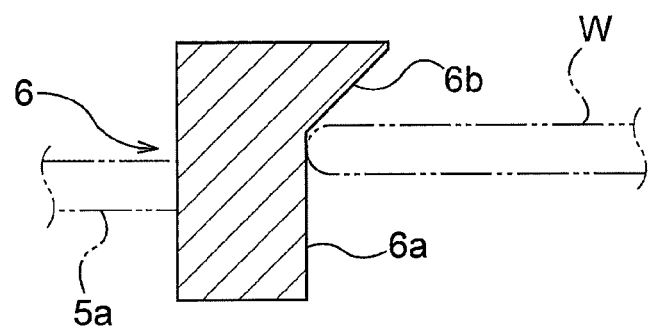

FIGS. 11A, 11B are views showing a gripping member 6 according to a first aspect, and FIG. 11A is a perspective view of the gripping member 6 and FIG. 11B is a cross-sectional view taken along line XI-XI of FIG. 11A. As shown in FIGS. 11A, 11B, the gripping member 6 comprises a semicircular column 6a and an inverted semitruncated cone 6b disposed on the semicircular column 6a. Specifically, the gripping member 6 is shaped as one-half of a shape composed of a circular cylinder and an inverted truncated cone which are integrated. The gripping member 6 has a flat end face fixed to a rod 5a (indicated by the two-dot chain lines) of the clamp mechanism 5. The gripping member 6 is mounted on the rod 5a of the clamp mechanism 5 so that the bottom face of the semicircular column 6a faces the upper surface of the main hand body 1 (see FIGS. 1A, 1B).

When the gripping member 6 shown in FIGS. 11A, 11B grips (chucks) the substrate W, the outer circumferential surface of the semicircular column 6a is brought into contact with the outer periphery of the substrate W (indicated by the two-dot chain lines) to grip (chuck) the substrate W. Because the inverted conical surface of the inverted semitruncated cone 6b protrudes above the upper surface of the substrate W, the substrate W can be prevented from rising upwardly when the substrate W is chucked. As shown in FIG. 11B, since the outer periphery of the substrate W is of a round shape (curved shape), the outer circumferential surface of the semicircular column 6a and the outer periphery of the substrate W are brought in point contact or nearly point contact with each other. Therefore, the generation of particles at the time when the substrate W and the gripping member 6 rub against each other can be minimized.

Figure 11C:
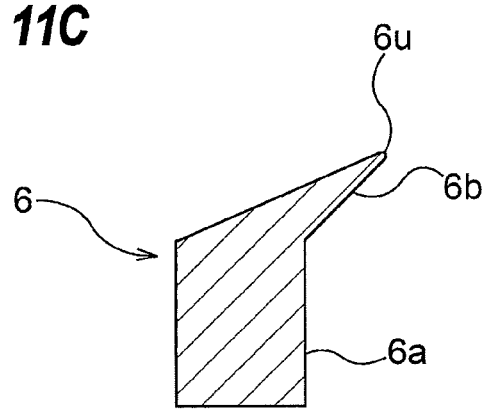
FIG. 11C is a cross-sectional view showing a modified example of the gripping member according to the first aspect shown in FIGS. 11A, 11B.

FIG. 11C is a cross-sectional view showing a modified example of the gripping member 6 according to the first aspect shown in FIGS. 11A, 11B. According to the modification, as shown in FIG. 11C, an upper portion of the gripping member 6 is cut off into a dish shape so that the gripping member 6 has a thin circular-arc upper end 6u. Therefore, the gripping member 6 is configured to prevent water droplets (liquid) from staying on its upper surface. Other structural details of the gripping member 6 shown in FIG. 11C are identical to those of the gripping member shown in FIGS. 11A, 11B.

Figure 12A:
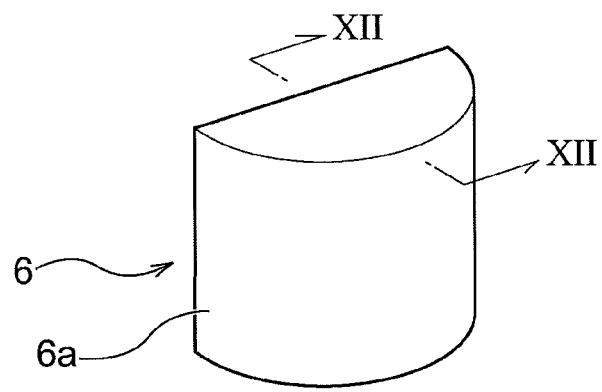
FIGS. 12A, 12B are views showing a gripping member according to a second aspect.
Figure 12B:
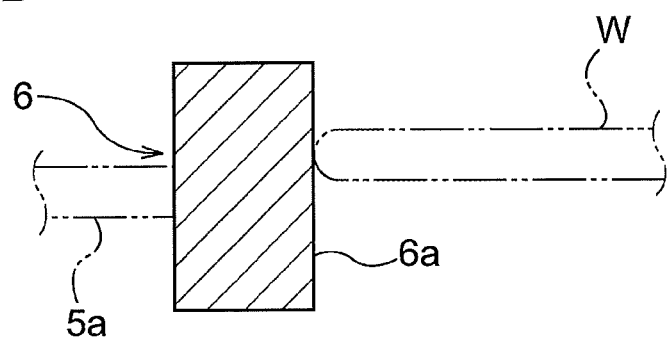

FIGS. 12A, 12B are views showing a gripping member 6 according to a second aspect, and FIG. 12A is a perspective view of the gripping member 6 and FIG. 12B is a cross-sectional view taken along line XII-XII of FIG. 12A. As shown in FIGS. 12A, 12B, the gripping member 6 comprises a semicircular column 6a. Specifically, the gripping member 6 is shaped as one-half of a circular cylinder. The gripping member 6 has a flat end face fixed to the rod 5a (indicated by the two-dot chain lines) of the clamp mechanism 5. The gripping member 6 is mounted on the rod 5a of the clamp mechanism 5 so that the bottom face of the semicircular column 6a faces the upper surface of the main hand body 1 (see FIGS. 1A, 1B).

When the gripping member 6 shown in FIGS. 12A, 12B grips (chucks) the substrate W, the outer circumferential surface of the semicircular column 6a is brought into contact with the outer periphery of the substrate W (indicated by the two-dot chain lines) to grip (chuck) the substrate W. As shown in FIG. 12B, since the outer periphery of the substrate W is of a round shape (curved shape), the outer circumferential surface of the semicircular column 6a and the outer periphery of the substrate W are brought in point contact or nearly point contact with each other. Therefore, the generation of particles at the time when the substrate W and the gripping member 6 rub against each other can be minimized.

Figure 13A:
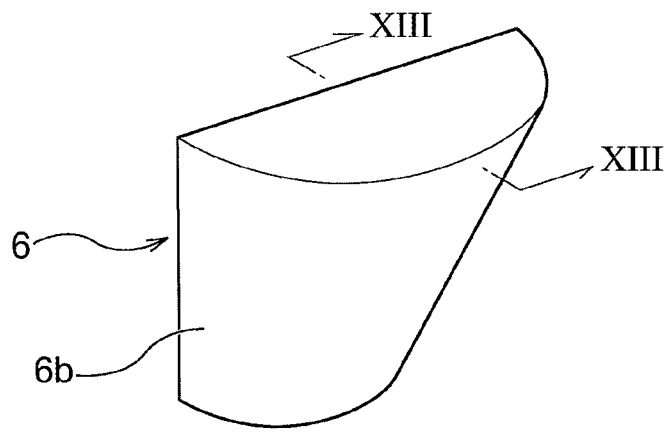
FIGS. 13A, 13B are views showing a gripping member according to a third aspect.
Figure 13B:
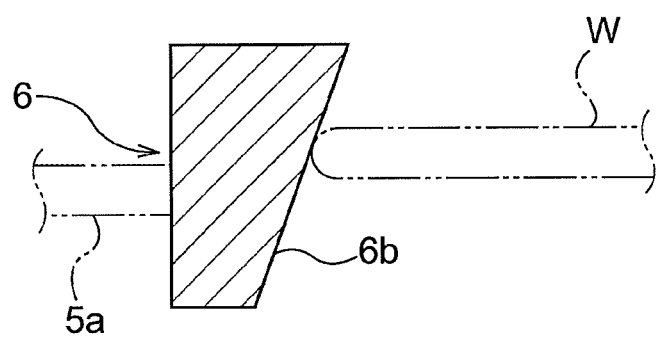

FIGS. 13A, 13B are views showing a gripping member 6 according to a third aspect, and FIG. 13A is a perspective view of the gripping member 6 and FIG. 13B is a cross-sectional view taken along line XIII-XIII of FIG. 13A. As shown in FIGS. 13A, 13B, the gripping member 6 comprises an inverted semitruncated cone 6b. Specifically, the gripping member 6 is shaped as one-half of an inverted truncated cone. The gripping member 6 has a flat end face fixed to the rod 5a (indicated by the two-dot chain lines) of the clamp mechanism 5. The gripping member 6 is mounted on the rod 5a of the clamp mechanism 5 so that the bottom face of the inverted semitruncated cone 6b faces the upper surface of the main hand body 1 (see FIGS. 1A, 1B).

When the gripping member 6 shown in FIGS. 13A, 13B grips (chucks) the substrate W, the outer circumferential surface of the inverted semitruncated cone 6b is brought into contact with the outer periphery of the substrate W to grip (chuck) the substrate W. Because the inverted conical surface of the inverted semitruncated cone 6b protrudes obliquely above the upper surface of the substrate W, the substrate W can be prevented from rising upwardly when the substrate W is chucked. As shown in FIG. 13B, since the outer periphery of the substrate W is of a round shape (curved shape), the outer circumferential surface of the inverted semitruncated cone 6b and the outer periphery of the substrate W are brought in point contact or nearly point contact with each other. Therefore, the generation of particles at the time when the substrate W and the gripping member 6 rub against each other can be minimized.

The receiving members 3 and the gripping members 6 shown in FIGS. 3 through 13 are made of plastics such as electrically conductive PEEK or high-density polyethylene. Because the substrate-contacting parts are electrically conductive, contamination of the substrate caused by electrically charged particle adhesion can be prevented.

FIG. 14 is a plan view showing a whole structure of a substrate processing apparatus for processing a substrate while sequentially transporting the substrates to a plurality of processing sections by using a substrate transfer mechanism (transfer robot) having a substrate transfer hand. The substrate transfer hands configured as shown in FIGS. 1 through 13 can be applied to all of the transfer robots used in the substrate processing apparatus shown in FIGS. 14, 15A and 15B. As shown in FIG. 14, the substrate processing apparatus has a housing 101 in a rectangular shape. An interior space of the housing 101 is divided into a loading-unloading section 102, a polishing section 103, and a cleaning section 104 by partitions 101a and 101b. The loading-unloading section 102, the polishing section 103, and the cleaning section 104 are assembled independently of each other and each section is independently exhausted. The substrate processing apparatus further includes a controller 105 for controlling substrate processing operations.

The loading-unloading section 102 has two or more (four in this embodiment) front loading units 120 on which wafer cassettes, each storing plural wafers (substrates), are placed. The front loading units 120 are arranged adjacent to the housing 101 along a width direction of the substrate processing apparatus (a direction perpendicular to a longitudinal direction of the substrate processing apparatus). Each of the front loading units 120 is configured to receive thereon an open cassette, an SMIF (Standard Manufacturing Interface) pod, or a FOUP (Front Opening Unified Pod). The SMIF and FOUP are a hermetically sealed container which houses a wafer cassette therein and are covered with partition walls to thereby provide interior environments isolated from an external space.

Further, the loading-unloading section 102 has a moving mechanism 121 extending along an arrangement direction of the front loading units 120. A single transfer robot (loader) 122 is installed on the moving mechanism 121 so as to be movable along the arrangement direction of the wafer cassettes. The transfer robot 122 is configured to move on the moving mechanism 121 so as to access the wafer cassettes mounted on the front loading units 120. The transfer robot 122 has vertically arranged two hands. The upper hand is used for returning a processed wafer to the wafer cassette, and the lower hand is used for removing a non-processed wafer from the wafer cassette. The upper hand and the lower hand can be used separately. The lower hand of the transfer robot 122 is configured to rotate about its own axis, so that the lower hand can reverse the wafer.

The loading-unloading section 102 is required to be a cleanest area. Therefore, a pressure in the interior of the loading-unloading section 102 is kept higher at all times than pressures in the exterior space of the substrate processing apparatus, the polishing section 103, and the cleaning section 104. On the other hand, the polishing section 103 is the dirtiest area, because slurry is used as a polishing liquid. Therefore, a negative pressure is developed in the polishing section 103, and the pressure in polishing section 103 is kept lower than the internal pressure of the cleaning section 104. A filter fan unit (not shown) having a clean air filter, such as HEPA filter or ULPA filter or a chemical filter, is provided in the loading-unloading section 102. This filter fan unit removes particles, toxic vapor, and toxic gas from air to form flow of clean air at all times.

The polishing section 103 is an area where a wafer is polished (planarized). This polishing section 103 includes a first polishing unit 103A, a second polishing unit 103B, a third polishing unit 103C, and a fourth polishing unit 103D. As shown in FIG. 14, the first polishing unit 103A, the second polishing unit 103B, the third polishing unit 103C, and the fourth polishing unit 103D are arranged along the longitudinal direction of the substrate processing apparatus.

As shown in FIG. 14, the first polishing unit 103A includes a polishing table 130A to which a polishing pad 110 having a polishing surface is attached, a top ring 131A for holding a wafer and pressing the wafer against the polishing pad 110 on the polishing table 130A so as to polish the wafer, a polishing liquid supply nozzle 132A for supplying a polishing liquid and a dressing liquid (e.g., pure water) onto the polishing pad 110, a dresser 133A for dressing the polishing surface of the polishing pad 110, and an atomizer 134A for ejecting a mixed fluid of a liquid (e.g., pure water) and a gas (e.g., nitrogen gas) or a liquid (e.g., pure water) in an atomized state onto the polishing surface of the polishing pad 110.

Similarly, the second polishing unit 103B includes a polishing table 130B to which a polishing pad 110 is attached, a top ring 131B, a polishing liquid supply nozzle 132B, a dresser 133B, and an atomizer 134B. The third polishing unit 103C includes a polishing table 130C to which a polishing pad 110 is attached, a top ring 131C, a polishing liquid supply nozzle 132C, a dresser 133C, and an atomizer 134C. The fourth polishing unit 103D includes a polishing table 130D to which a polishing pad 110 is attached, a top ring 131D, a polishing liquid supply nozzle 132D, a dresser 133D, and an atomizer 134D.

Figure 15A:
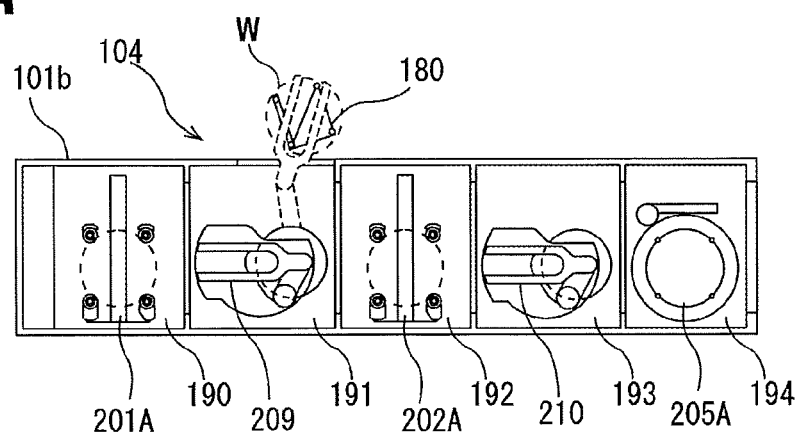
FIG. 15A is a plan view showing the cleaning section.
Figure 15B:
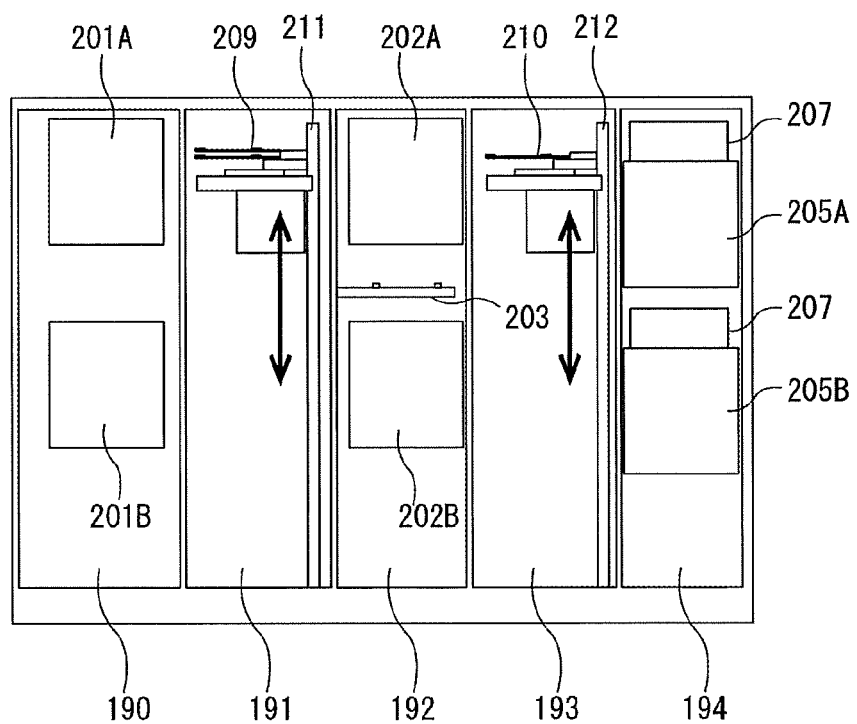
FIG. 15B is a side view showing the cleaning section.
Figure 16A:
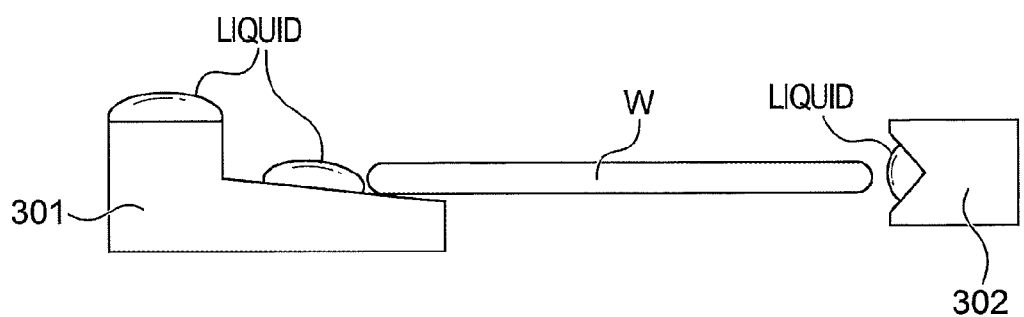
FIGS. 16A and 16B are schematic views showing the operation of a general edge-grip hand in a wet environment.
Figure 16B:
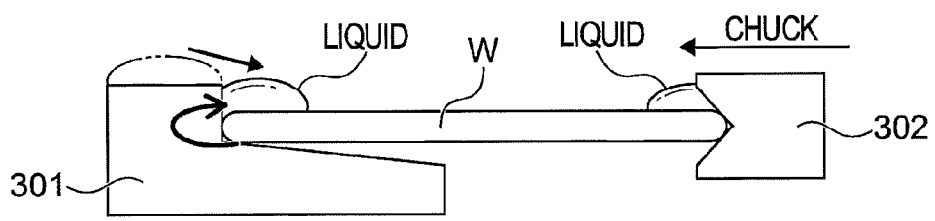

FIG. 15A is a plan view showing the cleaning section 104, and FIG. 15B is a side view showing the cleaning section 104. As shown in FIG. 15A and FIG. 15B, the cleaning section 104 is partitioned into a first cleaning chamber 190, a first transfer chamber 191, a second cleaning chamber 192, a second transfer chamber 193, and a drying chamber 194. In the first cleaning chamber 190, an upper primary cleaning module 201A and a lower primary cleaning module 201B are disposed along the vertical direction. Specifically, the upper primary cleaning module 201A is arranged above the lower primary cleaning module 201B. Similarly, in the second cleaning chamber 192, an upper secondary cleaning module 202A and a lower secondary cleaning module 202B are disposed along the vertical direction. The upper secondary cleaning module 202A is arranged above the lower secondary cleaning module 202B. The primary and secondary cleaning modules 201A, 201B, 202A, and 202B are a cleaning machine for cleaning the wafer using a cleaning liquid. The arrangement of these primary and secondary cleaning modules 201A, 201B, 202A, and 202B along the vertical direction offers an advantage of reducing a footprint area.

A temporary base 203 for the wafer is provided between the upper secondary cleaning module 202A and the lower secondary cleaning module 202B. In the drying chamber 194, an upper drying module 205A and a lower drying module 205B are disposed along the vertical direction. The upper drying module 205A and the lower drying module 205B are isolated from each other. Filter fan units 207 and 207 are provided on upper portions of the upper drying module 205A and the lower drying module 205B so as to supply a clean air into these drying modules 205A and 205B, respectively. The upper primary cleaning module 201A, the lower primary cleaning module 201B, the upper secondary cleaning module 202A, the lower secondary cleaning module 202B, the temporary base 203, the upper drying module 205A, and the lower drying module 205B are mounted on non-illustrated frames via bolts or the like.

A vertically-movable first transfer robot 209 is provided in the first transfer chamber 191, and a vertically-movable second transfer robot 210 is provided in the second transfer chamber 193. The first transfer robot 209 and the second transfer robot 210 are movably supported by vertically-extending support shafts 211 and 212, respectively. The first transfer robot 209 and the second transfer robot 210 have a drive mechanism such as a motor therein, respectively, so that the transfer robots 209 and 210 can move along the support shafts 211 and 212 in the vertical directions. The first transfer robot 209 has vertically arranged two hands comprising an upper hand and a lower hand, as with the transfer robot 122. The first transfer robot 209 is arranged such that the lower hand thereof can access the temporary base 180, as indicated by dotted lines in FIG. 15A. When the lower hand of the first transfer robot 209 accesses the temporary base 180, a shutter (not shown) provided on the partition 101b is opened.

The first transfer robot 209 is operated to transfer the wafer W between the temporary base 180, the upper primary cleaning module 201A, the lower primary cleaning module 201B, the temporary base 203, the upper secondary cleaning module 202A, and the lower secondary cleaning module 202B. When transferring a wafer to be cleaned (i.e., a wafer with slurry attached), the first transfer robot 209 uses its lower hand. On the other hand, when transferring a cleaned wafer, the first transfer robot 209 uses its upper hand. The second transfer robot 210 is operated to transfer the wafer W between the upper secondary cleaning module 202A, the lower secondary cleaning module 202B, the temporary base 203, the upper drying module 205A, and the lower drying module 205B. The second transfer robot 210 transfers only a cleaned wafer, and thus has a single hand. The transfer robot 122 shown in FIG. 14 uses its upper hand to remove the wafer from the upper drying module 205A or the lower drying module 205B, and returns the wafer to the wafer cassette. When the upper hand of the transfer robot 122 accesses the upper drying module 205A or the lower drying module 205B, a shutter (not shown) provided on the partition 101a is opened.

The cleaning section 104 has the two primary cleaning modules and the two secondary cleaning modules, as described above. With this configuration, the cleaning section 104 can provide plural cleaning lines for cleaning plural wafers in parallel. The term "cleaning line" is a transfer route of a wafer in the cleaning section 104 when the wafer is cleaned by the plural cleaning modules. For example, a wafer can be transferred via the first transfer robot 209, the upper primary cleaning module 201A, the first transfer robot 209, the upper secondary cleaning module 202A, the second transfer robot 210, and the upper drying module 205A in this order (see a cleaning line 1). In parallel with this wafer transfer route, another wafer can be transferred via the first transfer robot 209, the lower primary cleaning module 201B, the first transfer robot 209, the lower secondary cleaning module 202B, the second transfer robot 210, and the lower drying module 205B in this order (see a cleaning line 2). In this manner, plural (typically two) wafers can be cleaned and dried substantially simultaneously by the two parallel cleaning lines.

Although certain preferred embodiments of the present invention have been shown and described in detail, it should be understood that various changes and modifications may be made without departing from the scope of the appended claims.

What is claimed is:

1. A substrate transfer hand comprising: a main hand body having a flat plate shape; a plurality of receiving members provided on the main hand body and configured to hold an edge of a substrate; and a gripping member movably provided with respect to the main hand body and configured to grip the edge of the substrate, the gripping member being moved by an actuator to sandwich the substrate between the receiving members and the gripping member to fix the substrate; wherein the gripping member includes a columnar body extending from a plane of the flat plate shape, the gripping member being arranged to provide a single point of contact between the columnar body and the substrate to be gripped, wherein the columnar body includes a protrusion extending radially outwardly from a periphery of an upper portion of the columnar body, the protrusion being vertically-spaced from flat plate shape to control upward rising of the substrate, and wherein the gripping member has a top surface that declines outwardly away from a location of the substrate to be gripped by the gripping member; wherein the plurality of receiving members each have a flat plate-shaped support portion mounted on the main hand body, a substrate outer periphery holding supported on the support portion and configured to hold an outer periphery of the substrate, and a substrate lower surface holding portion supported on the support portion and configured to hold a lower surface of the substrate; the substrate outer periphery holding portion has a portion provided vertically from the support portion and configured to hold the substrate in contact with the outer periphery of the substrate; the substrate lower surface holding portion has a portion disposed between an inner peripheral side of the substrate lower surface holding portion and the substrate outer periphery holding portion, and inclined toward the substrate outer periphery holding portion; and the substrate outer periphery holding portion and the substrate lower surface holding portion are spaced from each other by a gap or a groove.

2. The substrate transfer hand according to claim 1, wherein the portion of the substrate outer periphery holding portion configured to hold the substrate in contact with the outer periphery of the substrate comprises an circular-arc surface along the outer periphery of the substrate.

3. The substrate transfer hand according to claim 1, wherein the portion of the substrate outer periphery holding portion configured to hold the substrate in contact with the outer periphery of the substrate comprises a polygonal prism having a top line which is brought into contact with the outer periphery of the substrate or a columnar body having a curved surface.

4. The substrate transfer hand according to claim 1, wherein the substrate outer periphery holding portion comprises a plurality of substrate outer periphery holding portions disposed across the gap or the groove.

5. The substrate transfer hand according to claim 1, wherein the inclined portion of the substrate lower surface holding portion comprises an inclined surface.

6. The substrate transfer hand according to claim 1, wherein the inclined portion of the substrate lower surface holding portion comprises a polygonal prism having a top line which is brought into contact with the outer periphery of the substrate or a columnar body having a curved surface.

7. The substrate transfer hand according to claim 1, wherein the substrate outer periphery holding portion has an upper portion which is cut off to provide a thin edge-like upper end.

8. A substrate processing apparatus comprising:
a substrate transfer mechanism having a substrate transfer hand according to claim 1; and
a processing unit configured to process a substrate transferred by the substrate transfer mechanism.

9. A substrate transfer hand comprising: a main hand body having a flat plate shape; a plurality of receiving members provided on the main hand body and configured to hold an edge of a substrate; and a gripping member movably provided with respect to the main hand body and configured to grip the edge of the substrate, the gripping member being moved by an actuator to sandwich the substrate between the receiving members and the gripping member and to fix the substrate; wherein the plurality of receiving members each have a flat plate-shaped support portion mounted on the main hand body, a substrate outer periphery holding portion supported on the support portion and configured to hold an outer periphery of the substrate, and a substrate lower surface holding portion supported on the support portion and configured to hold a lower surface of the substrate; wherein the gripping member has a portion configured to grip the substrate in contact with the outer periphery of the substrate, the portion configured to grip the substrate comprising a columnar body having a curved surface; wherein the gripping member includes an upper portion having a thin edge-like upper end protruding outwardly from a lower portion of the gripping member to control upward rising of the substrate; and wherein the gripping member has a top surface that declines outwardly away from a location of the substrate to be gripped by the gripping member.

10. The substrate transfer hand according to claim 9, wherein the columnar body having the curved surface comprises at least a portion of a circular cylinder or at least a portion of an inverted truncated cone.

11. The substrate transfer hand according to claim 9, wherein the columnar body having the curved surface comprises an integral combination of a columnar body comprising at least a portion of a circular cylinder located at a lower side and a columnar body comprising at least a portion of an inverted truncated cone located at an upper side and having the thin edge-like upper end.

12. A substrate processing apparatus comprising:
a substrate transfer mechanism having a substrate transfer hand according to claim 9; and
a processing unit configured to process a substrate transferred by the substrate transfer mechanism.

13. A substrate transfer hand comprising: a main hand body; a receiving member provided on the main hand body and configured to hold an edge of a substrate; and a gripping member movably provided with respect to the main hand body and configured to grip the edge of the substrate, the gripping member being moved by an actuator to sandwich the substrate between the receiving member and the gripping member and to fix the substrate; wherein the receiving member has a substrate outer periphery holding surface configured to hold an outer periphery of the substrate in contact with the outer periphery of the substrate, and a substrate lower surface holding surface configured to hold a lower surface of the substrate; wherein the substrate outer periphery holding surface and the substrate lower surface holding surface are spaced from each other; and wherein the gripping member having an upper portion having both a top surface and a bottom surface that each respectively declines outwardly away from a location of the substrate to be gripped by the gripping member.

14. A substrate processing apparatus comprising:
a substrate transfer mechanism having a substrate transfer hand according to claim 13; and
a processing unit configured to process a substrate transferred by the substrate transfer mechanism.

* * * * *